(12) United States Patent
Cordoba

(10) Patent No.: US 7,006,389 B2
(45) Date of Patent: Feb. 28, 2006

(54) VOLTAGE TRANSLATOR FOR MULTIPLE VOLTAGE OPERATIONS

(75) Inventor: Michael V. Cordoba, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 38 days.

(21) Appl. No.: 10/734,944

(22) Filed: Dec. 12, 2003

(65) Prior Publication Data

US 2005/0128822 A1  Jun. 16, 2005

(51) Int. Cl.
*G11C 7/00* (2006.01)
*H03K 19/0175* (2006.01)

(52) U.S. Cl. ............. 365/189.09; 365/189.11; 326/63; 326/68; 326/81; 327/333

(58) Field of Classification Search ......... 326/63, 326/68, 81; 327/333; 365/189.09, 189.11
See application file for complete search history.

(56) References Cited

U.S. PATENT DOCUMENTS 5,510,731 A * 4/1996 Dingwall ............. 326/63
5,723,986 A * 3/1998 Nakashiro et al. ......... 326/81
6,043,699 A * 3/2000 Shimizu ................ 327/333
6,060,904 A * 5/2000 Shimoda ................ 326/68

* cited by examiner

*Primary Examiner*—Son Mai
(74) *Attorney, Agent, or Firm*—Williams, Morgan & Amerson, P.C.

(57) ABSTRACT

A method and apparatus is provided for a voltage translator for performing a voltage-level translation of a signal. The voltage translator of the present invention includes a first transistor that is coupled to a control signal. The control signal is in a first voltage range. The voltage translator also includes a first one-shot circuit driven by the first transistor. The first one-shot circuit is capable of providing a pulse. The voltage translator also includes a second transistor capable of receiving a complementary signal of the control signal. A first pair and a second pair of transistors are included in the voltage translator. Each pair of transistors is operatively coupled to the first and second transistors. The first and second pairs of transistors are adapted to provide a transition of a signal from a first voltage range to a second voltage range.

50 Claims, 8 Drawing Sheets

P-Channel Implementation of the Translator

N-Channel Implementation of the One-Shot

VOLTAGE TRANSLATOR FOR MULTIPLE VOLTAGE OPERATIONS

BACKGROUND OF THE INVENTION

1. Field of the Invention

This invention relates generally to an electronic device, and, more specifically, to providing a voltage translator for transitioning from a first voltage level to a second voltage level.

2. Description of the Related Art

Modern integrated circuit devices are comprised of millions of semiconductor devices, e.g., transistors, formed above a semiconductor substrate, such as silicon. These devices are very densely packed, i.e., there is little space between them. Similarly, densely packed electrically conducting lines may also be formed in the semiconductor substrate. By forming selected electrical connections between selected semiconductor devices and selected conducting lines, circuits capable of performing complex functions may be created. For example, bits of data may be stored by providing electrical current to a plurality of bit lines and an orthogonal plurality of wordlines that may be electrically coupled to one or more capacitors in a semiconductor memory.

The semiconductor memory may be a dynamic random access memory, a flash memory, and the like. The semiconductor memory typically comprises an array of memory cells, address decoding circuitry for selecting one, or a group, of the memory cells for reading or writing data, sensing circuitry for detecting the digital state of the selected memory cell or memory cells, and input/output lines to receive the sensed data and convey that information for eventual output from the semiconductor memory. In many cases, the array of memory cells will be sub-divided into several sub-arrays, or subsets, of the complete collection of memory cells. For example, a semiconductor memory having 16 megabits ($2^{24}$ bits) of storage capacity, may be divided into 64 sub-arrays, each having 256K ($2^{18}$) memory cells.

In electronic devices today, many integrated circuit chips use designs that are used to promote savings and power consumption. This is particularly true for mobile and wireless type devices. Many times, devices, such as microprocessors, memories, and other integrated circuit chips are designed to operate at lower operating voltages. Often, more than one operating voltage may be implemented into a single integrated circuit chip. There are various portions of a circuit that are implemented into an integrated circuit chip that, for various reasons, operate at different voltage levels. These reasons may include operating speed, type of devices being used in the circuit, efficient switching voltages, and the like.

In order to provide efficient operation of a device, such as an integrated circuit chip, a transition between various operating voltage modes is desirable. For example, operation from the operating range of $V_{CC}$ to ground may be modified for operation from $V_{CC}$ to $V_{BB}$, wherein $V_{BB}$ may be a voltage level that is above or below ground. Therefore, efficient switching to and from $V_{CC}$-ground operating levels to $V_{CC}$-$V_{BB}$ is desirable. State-of-the-art designs implement a switching between various voltage levels, however, many inefficiencies may result, including current leakage and slow transitions in the designs of today.

In order to translate operating voltages, designers have implemented inverters that translate an operating voltage from $V_{CC}$ to ground to a second inverter that translates from $V_{CC}$ to $V_{BB}$. However, this proves to be problematic since it is difficult to completely shut off the second inverter stage since the voltage generally does not fall all the way to ground. In other words, with two inverters, one inverter has a negative node tied to ground, and when the input of that inverter goes to logic high, the output will go to ground. However, when the second input to the second inverter goes to $V_{BB}$ there is a leakage current since a positive voltage on the second inverter exists. To overcome this problem, designers have moved towards a translator type design that translates voltage levels.

Turning now to FIG. 1, a typical prior art circuit for implementing the switching of supply voltage levels is illustrated. FIG. 1 illustrates a prior art voltage level translator 100 for translating a voltage level from $V_{CC}$ to $V_{SS}$ (ground) to $V_{CC}$ to $V_{BB}$. Upon assertion of the negative true logic signal IN on a line 105, a P-channel transistor 110, whose source is coupled to $V_{CC}$ on the line 103, is activated. Upon the assertion of IN (i.e., a transition from high to low of the signal IN on the line 105), a line 107 coupled to the drain of the transistor 110 is transitioned to a level of $V_{CC}$. The complementary signal of IN, which is INB on a line 115, is sent to another P-channel transistor 120 whose source is coupled to $V_{CC}$ on a line 123. Upon the assertion of IN, the signal INB on the line 115 transitions to logic-high, therefore, the drain of transistor 120, which is coupled to a signal OUT on a line 135, is disconnected from $V_{CC}$. The complementary signal to OUT on the line 135 is a signal OUTB on a line 125, which is the inverse of OUT.

The transition of the signal OUTB on the line 125, which is also coupled to a drain of an N-channel transistor 140, whose source is coupled to $V_{BB}$ via a line 145. Therefore, the N-channel transistor 140 will be turned off. At the same time, the complementary signal OUTB on the line 125 is also coupled to a gate 153 of a second N-channel transistor 150, whose source is coupled to $V_{BB}$ via a line 155. Therefore, during this time, when the complementary signal OUTB on the line 125 is high, the N-channel transistor 150 is turned on. When the N-channel transistor 150 is turned on, a connection to $V_{BB}$ to OUT on the line 135 is established. Therefore, an operating voltage level of $V_{CC}$ to $V_{BB}$ is established upon the assertion of IN on the line 105.

Currently, in order to implement the prior art voltage level translator 100, P-channel devices used in such circuits are usually substantially large. Therefore, there are transition delays due to these types of P-channel devices, which cause the transition from $V_{CC}$ to ground to $V_{CC}$-$V_{BB}$ to be inefficient. Another problem is that when the voltage level translator 100 receives an input that goes to logic low (on the line 105), and the OUTB on the line 125 goes to logic high, this transition occurs in a substantially fast manner. However, the opposite state, where the output OUT on the line 135 transitions from logic low to a logic high state, there is a delay in the pull down because N-channel transistors are relatively weak compared to the typical P-channel transistors that are used. One of the reasons that the N-channels in the circuit are smaller is because the voltage level translator 100 may not properly switch if they are made of a similar size as the P-channel transistors. This could create a problem when the nodes of the output OUT, on the line 135 and OUTB on line 125 transition to a low state, and since transitioning to a low state is a very slow transition, the transition may occur fast enough to regain its voltage level back up to the level of $V_{BB}$. Therefore, the transition going to $V_{BB}$ becomes too slow. This runs contrary to the motivation of switching from $V_{CC}$ to a $V_{BB}$ mode, therefore, a relatively fast switching is needed for proper voltage level transition for efficient operation of the circuitry supported by the voltage level translator 100.

These transition problems are exacerbated by the more recent drive to reduce the operating voltage level of $V_{CC}$. Designers are generally pushing for lower and lower $V_{CC}$ levels, which causes even further delays in the transitions described above. This is true because if the P-channel transistors get weaker because $V_{CC}$ gets smaller, then there is very little gate-source voltage so the P-channels transistors have to make a bigger drive to make a proper transition. As the transition of the transistor moves from logic low to logic high, there is a drive that is pulling the transistor down, therefore, the transition is not properly made often, causing excessive current consumption. The industry generally lacks an efficient method and apparatus for translating efficiently from a voltage level of $V_{CC}$ to $V_{SS}$ to a voltage level of $V_{CC}$ to $V_{BB}$.

The present invention is directed to overcoming, or at least reducing, the effects of, one or more of the problems set forth above.

SUMMARY OF THE INVENTION

In one aspect of the present invention, a circuit is provided for performing a voltage-level translation of a signal. The circuit of the present invention includes a transistor circuitry for receiving an input signal for translating a signal from a first voltage range to a second voltage range. The circuit also includes a first one-shot and a second one-shot that are coupled to the transistor circuitry. The first and second one-shots are capable of providing at least one pulse for translating the input signal from the first voltage range to the second voltage range.

In another aspect of the present invention, a voltage translator is provided for performing a voltage-level translation of a signal. The voltage translator of the present invention includes a first transistor that is coupled to a control signal. The control signal is in a first voltage range. The voltage translator also includes a first one-shot circuit driven by the first transistor. The first one-shot circuit is capable of providing a pulse. The voltage translator also includes a second transistor capable of receiving a complementary signal of the control signal. A first pair and a second pair of transistors are included in the voltage translator. Each pair of transistors is operatively coupled to the first and second transistors. The first and second pairs of transistors are adapted to provide a transition of a signal from a first voltage range to a second voltage range.

In another aspect of the present invention, a system board is provided for performing a voltage-level translation of a signal. The system board of the present invention includes a processor and a memory device that is coupled to the processor. The memory device includes a voltage translator circuit. The voltage translator circuit includes a transistor circuitry for receiving an input signal for translating a signal from a first voltage range to a second voltage range. The voltage translator also includes a first one-shot and a second one-shot that are coupled to the transistor circuitry. The first and second one-shots are adapted to provide at least one pulse for translating the input signal from the first voltage range to the second voltage range.

In yet another aspect of the present invention, a method is provided for performing a voltage-level translation of a signal. The method includes providing a transistor circuitry for receiving an input signal for translating a signal from a first voltage range to a second voltage range. The method also includes providing first and second one-shots that are coupled to the transistor circuitry. The one-shots in the method are capable of providing at least one pulse for translating the input signal from the first voltage range to the second voltage range.

In yet another aspect of the present invention, a memory device is provided for performing a voltage-level translation of a signal. The memory device. of the present invention includes a transistor circuitry for receiving an input signal and for translating a signal from a first voltage range to a second voltage range. The memory device also includes a first one-shot and a second one-shot that are coupled to the transistor circuitry. The first and second one-shots are adapted to provide at least one pulse for translating the input signal from the first voltage range to the second voltage range.

BRIEF DESCRIPTION OF THE DRAWINGS

The invention may be understood by reference to the following description taken in conjunction with the accompanying drawings, in which like reference numerals identify like elements, and in which.

Figure 1:
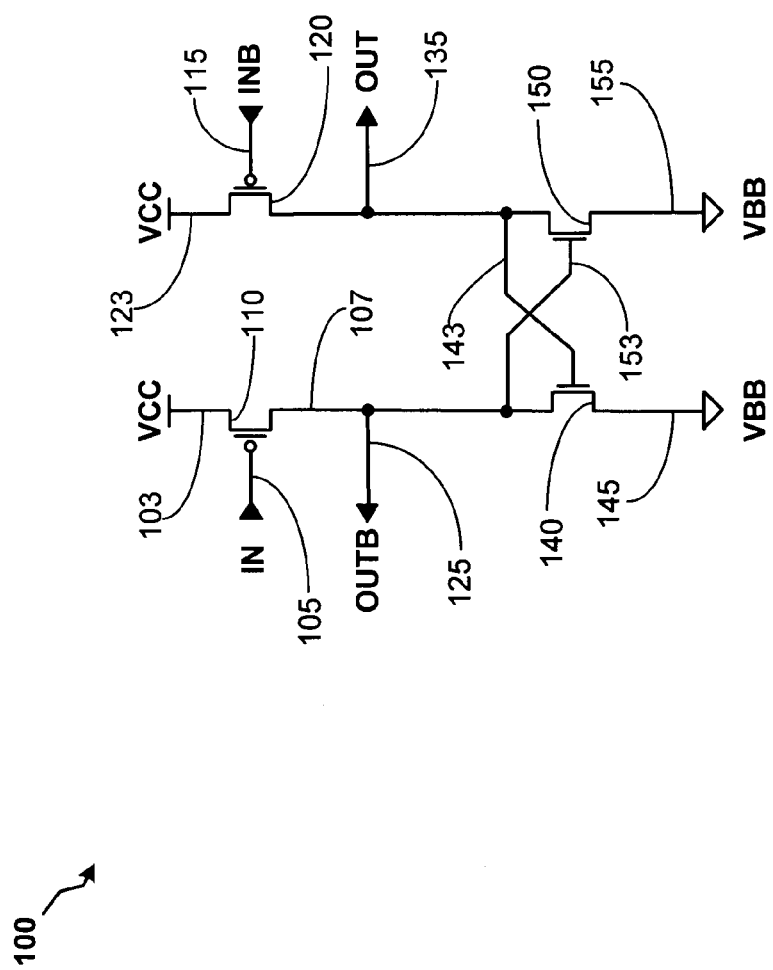
FIG. 1 illustrates a typical prior art circuit for implementing the switching of supply voltage levels.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

State of the art technology for providing multiple operating voltages in a system exists to increase power consumption efficiency. This is of particular importance in battery operated and/or wireless type devices. Generally, a single electronic device, such as an integrated circuit chip, may utilize a plurality of operating voltages. In order to accommodate multiple operating voltages (or operating voltage ranges), translators may be used to switch from one operating mode to another operating level. Embodiments of the present invention provide a translator for generating an efficient transition from one voltage level to another. For example, a voltage transition from $V_{CC}$—ground level, to translation to a voltage level of $V_{CC}$ to $V_{BB}$ may be generated using embodiments of the present invention. The translator provided by embodiments of the present invention may be used to generate a positive to negative voltage translation, or a negative to positive translation. Additionally, the translator provided by the present invention may be implemented in an N-channel type arrangement, or alternatively, in a P-channel type arrangement. Embodiments of the present invention utilize a one-shot implementation into the translator to perform an efficient translation from a first operating voltage level to a second operating voltage level.

Figure 2:
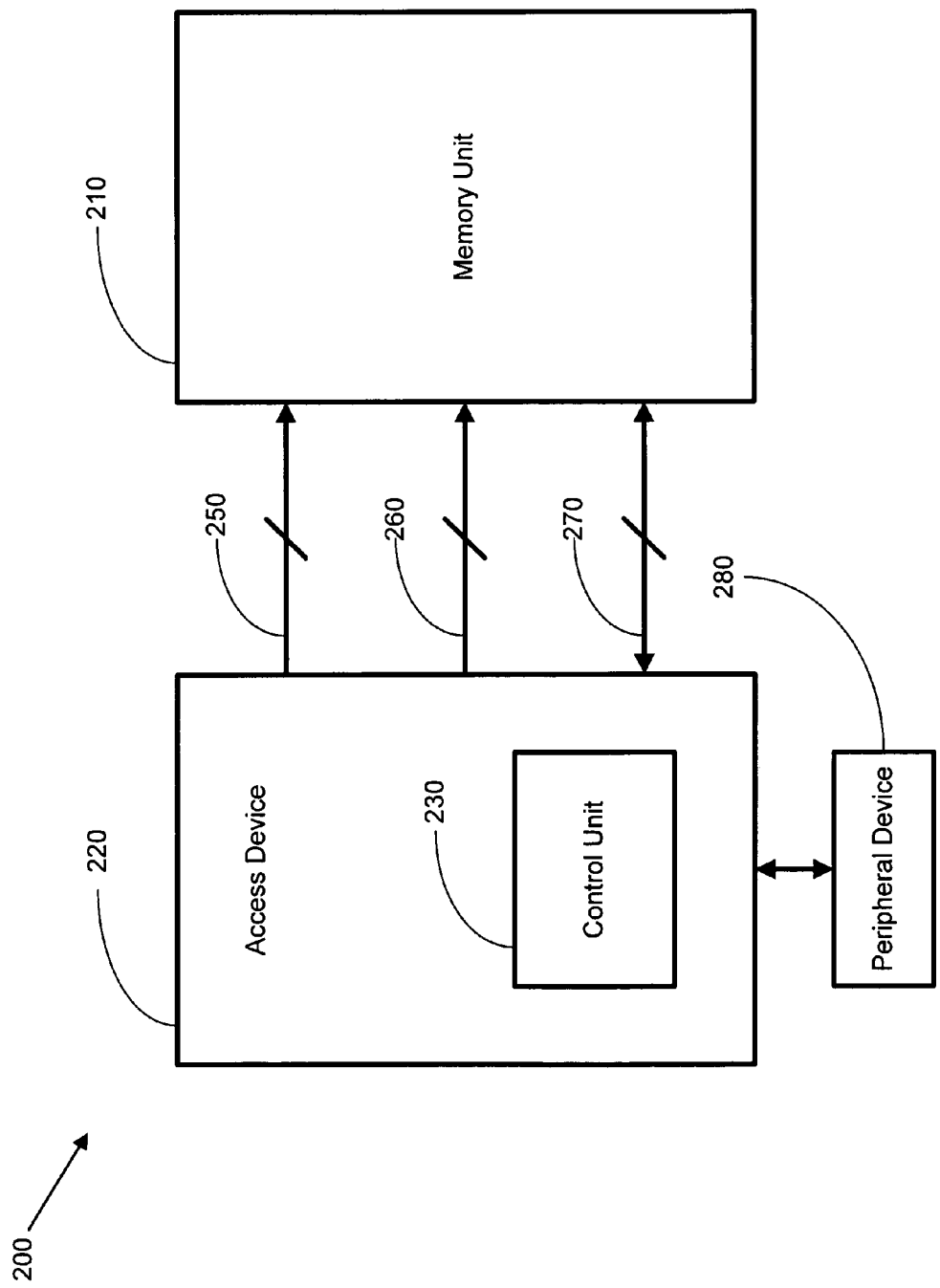
FIG. 2 illustrates a block diagram of a system including a device that is capable of implementing a translator, in accordance with one illustrative embodiment of the present invention.

Referring now to FIG. 2, a block diagram of a system 200 is illustrated, in accordance with one embodiment of the present invention. The system 200 comprises a memory unit 210 capable of storing data, which may be accessed by an access device 220. The access device 220 comprises a control unit 230 capable of accessing data stored in the memory unit 210. The access device 220 may be any device that uses the memory unit 210 to store data, read data, or both. Examples of the access device 220 may include, but are not limited to, a computer unit such as a desktop or portable computer, a camera, a telephone, a cellular phone, a television, a radio, a calculator, a personal digital assistant (PDA), a network switch, a setup-box, and the like. The access device 220 may be coupled to a peripheral device 280, which may be a display device, such as a monitor, or a variety of devices, such as a CD-RW device, a DVD device, a storage device, and the like.

The control unit 230, in one embodiment, may manage the overall operations of the access device 220, including writing and reading data to and from the memory unit 210. The control unit 230 may comprise a microprocessor, a microcontroller, a digital signal processor, a processor card (including one or more microprocessors or controllers), a memory controller, or other control or computing devices.

Figure 3:
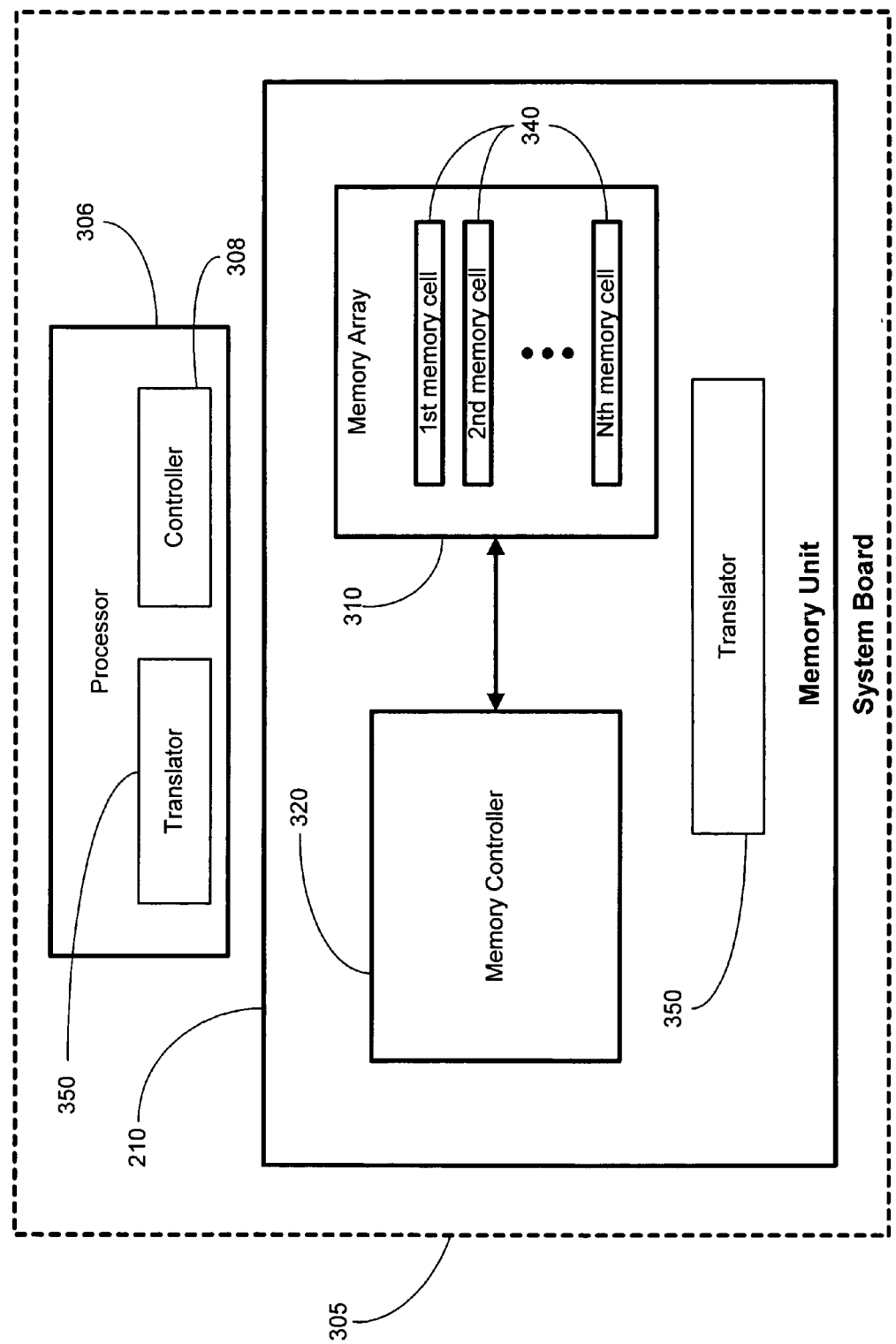
FIG. 3 illustrates a block diagram of the implementation of the translators in various devices on a system board, in accordance with one illustrative embodiment of the present invention.

The memory unit 210 in the illustrated embodiment is a non-volatile memory, such as a flash memory. In one embodiment, the memory unit 210 may be an external memory, such as a memory stick, and may be accessed when inserted into a slot (not shown) of the access device 220. When inserted into the access device 220, the access device 220 provides the appropriate power and control signals to access memory locations in the memory unit 210. The memory unit 210 may be external to, or internal (e.g., integrated) to, the access device 220. The access device 220, such as a computer system, may employ a memory unit 210 that is integrated within the computer system to store data (e.g., BIOS [basic input/output system]) related to the computer system. In one embodiment, the memory unit 210 may be a dynamic random access memory (DRAM), a double-data rate synchronous DRAM (DDR SDRAM), a Rambus™ DRAM (RDRAM), a FLASH memory unit, or the like. As shown in FIG. 3, the memory unit 210 may be part of a system board 305 (e.g., a printed circuit board) that includes a processor 306. The system board 305 may be a motherboard that is utilized in a variety of types of computer systems, such as an IBM compatible computer system, a workstation computer system, a mainframe computer system, an Apple computer system, a portable computer, a PDA, and the like.

Turning now to FIG. 3, a block diagram representation of the memory unit 210 of FIG. 2 is illustrated. The memory unit 210 may comprise a memory array 310 and a memory controller 320. The memory array 310 may contain one or more memory cells 340. The memory array 310 may comprise a plurality of memory cells 340 ($1^{st}$ through $N^{th}$ memory cells 340) that are capable of storing data. The memory controller 320 is a controller that is part of the memory unit 210. The memory controller 320 is capable of receiving and executing memory access functions in response to instructions from the processor 306, which contain its own controller 308 to access memory in the memory unit 210. In one embodiment, the access device 220 of FIG. 2 may access the memory unit 210 via a memory controller 320. Referring again to FIG. 2, the memory unit 210 may receive control signals across control lines 250 from the control unit 230 to control access to the memory array 310 of FIG. 3. Access to the memory array 310 may be directed to the one or more memory cells 340 in response to address signals received across address lines 260 as shown in FIG. 2. Once accessed, data from the memory array 310 may be written to or read from the memory array 310 across data lines 270 as shown in FIG. 2.

Turning back to FIG. 3, in one embodiment, the processor 306 may also comprise a translator 350. Additionally, the memory unit 210 may also comprise a translator 350. The processor 306 and the memory unit 210 may each contain a plurality of circuit portions that may operate at different voltage levels. For example, the memory unit 210 may operate the memory controller 320 at a first voltage level (e.g., $V_{CC}$ to ground) wherein the memory array 310 in the memory unit 210 may be operated at a second voltage level (e.g., $V_{CC}$ to $V_{BB}$). The translator 350 may provide an efficient process of translating from the first voltage level to the second voltage level. A more detailed illustration and description of the translator 350 is provided in various figures and accompanying descriptions below.

Figure 4:
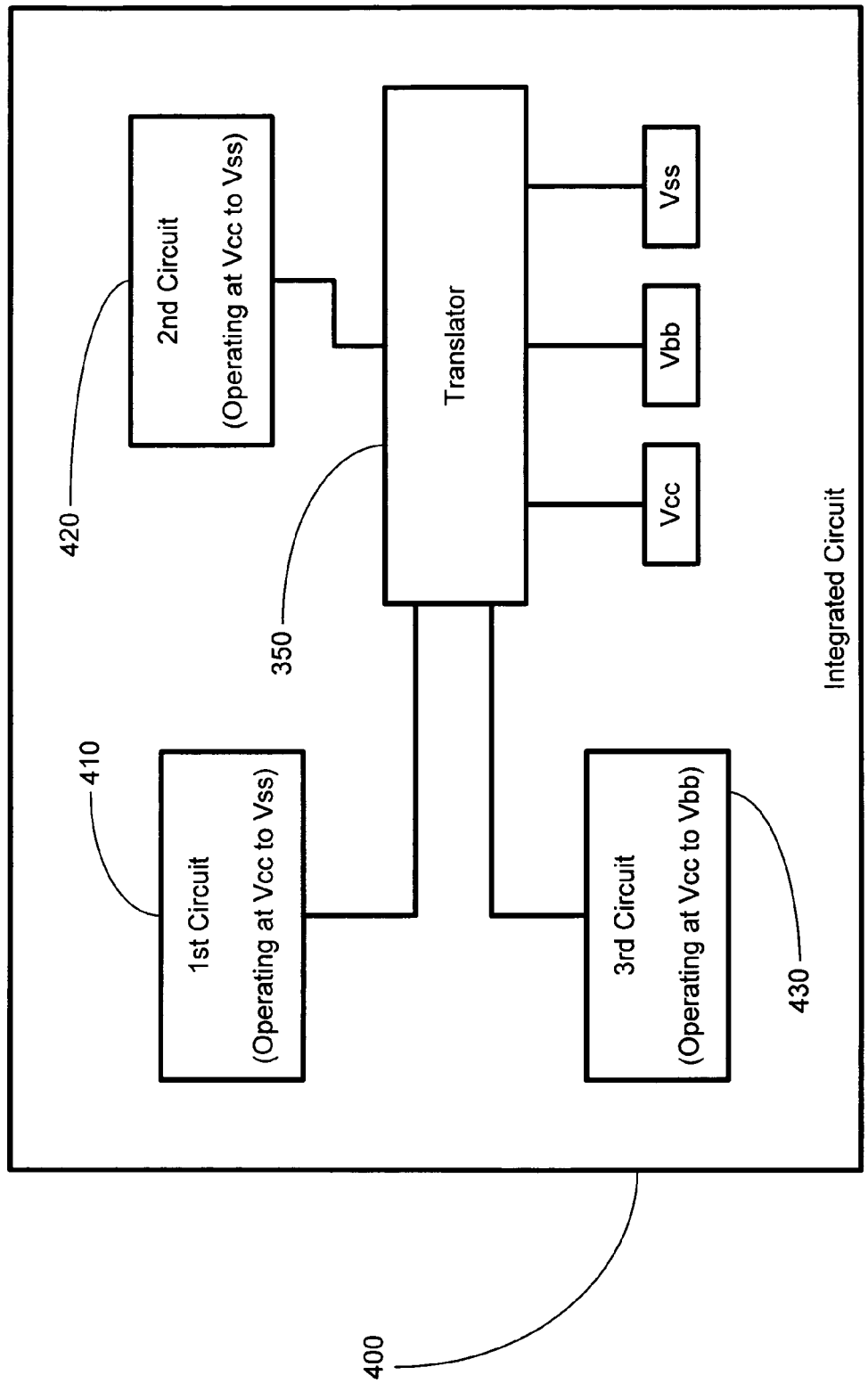
FIG. 4 illustrates a block diagram depiction of an implementation of a translator in an integrated circuit, in accordance with one illustrative embodiment of the present invention.

Turning now to FIG. 4, a block diagram depiction of an integrated circuit 400, which may be implemented into an integrated circuit chip, is illustrated. The integrated circuit 400 may comprise a first circuit 410, a second circuit 420, and a third circuit 430. Additionally, the integrated circuit 400 may comprise a translator 350. For example, the first and second circuits 410, 420 may operate in a first voltage level of $V_{CC}$ to $V_{SS}$ (or ground). The third circuit 430 may operate at a voltage level of $V_{CC}$ to $V_{BB}$. It may be problematic to interface the first circuit 410 and the third circuit 430 directly, because voltage level errors and current leakage may result. Therefore, the translator 350 may be utilized to translate the voltage levels in order for proper interfacing of the first circuit 410 to the third circuit 430 while interfacing the second circuit 420 to the third circuit 430.

The translator 350 may receive several voltage levels such as $V_{CC}$, $V_{BB}$, and $V_{SS}$. The translator 350 is then capable of translating voltage levels from the first circuit 410 ($V_{CC}$ to $V_{SS}$) to the third circuit 430 ($V_{CC}$ to $V_{BB}$). Additionally, the translator 350 is capable of translating signal levels from the third circuit 430 ($V_{CC}$ to $V_{BB}$) to the signal levels of the second circuit 420 ($V_{CC}$ to $V_{SS}$). The translator 350 provided by the present invention is used to provide an efficient translation of voltage levels such that various portions of the integrated circuit 400 may interface each other in an efficient manner with reduced delays in current leakage during the transitions. In one embodiment, the translator 350 may be an N-channel translator 350. In an alternative embodiment, the translator 350 may be a P-channel translator 350. The translator 350 provided by embodiments of the present invention may be used to generate a positive to negative voltage translation, or a negative to positive translation.

Figure 5:
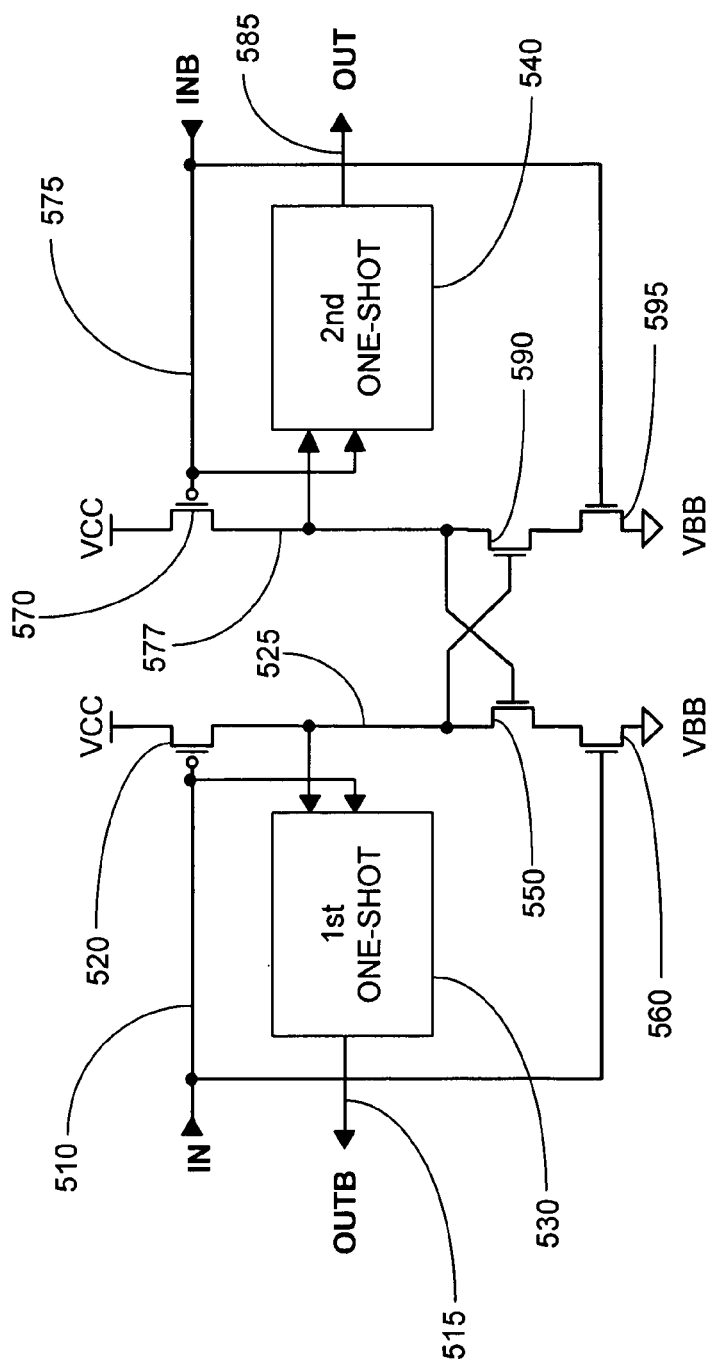
FIG. 5 illustrates a more detailed depiction of a P-channel implementation of the translator of FIGS. 1–4, in accordance with one illustrative embodiment of the present invention.

Turning now to FIG. 5, one embodiment of an illustration of the translator 350 is illustrated. In order to implement a voltage level change, an assertion of a signal IN on a line 510 is asserted. In the embodiment of FIG. 5, a P-channel implementation of the translator 350 is illustrated. The input signal IN on the line 510 is coupled to a gate input to a P-channel transistor 520. The source of the P-channel transistor 520 is coupled to $V_{CC}$.

The drain terminal of the P-channel transistor 520 is coupled to a first one-shot 530. Additionally, the input IN signal on the line 510 is also coupled to the first one-shot 530. Upon the assertion of the input signal IN on the line 510, which in this case is the transition from high to low (active low), the P-channel transistor 520 is turned on wherein a line 525 is connected to $V_{CC}$. This connection activates a first one-shot 530. The first one-shot 530 provides a pulse to drive the output complement signal OUTB on a line 515. A complementary signal of the IN signal (i.e., INB) is on a line 575. When the IN signal on the line 510 goes low (i.e., active), the INB signal on the line 575 is unasserted, or in this case goes high.

The INB signal on the line 575 is coupled to the gate terminal of a second P-channel transistor 570. The source terminal of the P-channel transistor 570 is coupled to $V_{CC}$ and the drain terminal of the second P-channel transistor 570 is coupled to a line 577. The line 577 and the INB signal on the line 575 are both coupled to a second one-shot 540. The second one-shot 540 is coupled to an output signal on a line 585 (OUT). The second one-shot 540 signal provides a low going pulse. A feedback type of situation emerges from the usage of the first and second one-shots 530, 540. Upon the activation of the IN signal on the line 510, the OUTB signal on a line 515 generally goes low momentarily due to the first one-shot 530 and then shuts off. Eventually, for the completion of the transition from operating level of $V_{CC}$ to ground, to $V_{CC}$ to $V_{BB}$, the OUTB signal on the line 515 may be lowered to the $V_{BB}$ level, which is described below.

The drain of the first P-channel transistor 520 on the line 525 is coupled to a drain of an N-channel transistor 550. This N-channel transistor 550, via its gate terminal, is coupled to the line 577, which is the drain terminal of the P-channel transistor 570. The source of the N-channel transistor 550 is coupled to the drain terminal of a second N-channel transistor 560. The gate terminal of the N-channel transistor 560 is coupled to the IN signal on the line 510. The source terminal of the second N-channel transistor 560 is coupled to $V_{BB}$. Similarly, the drain terminal of the second P-channel transistor 570 on the line 577 is coupled to a third N-channel transistor 590. The gate terminal of the third N-channel transistor 590 is coupled to the drain of the P-channel transistor 520 via the line 525. The source terminal of the third N-channel transistor 590 is coupled to a fourth N-channel transistor 595 via its drain terminal.

The gate terminal of the fourth N-channel transistor 595 is coupled to the INB signal on the line 575. The source terminal of the fourth N-channel transistor 595 is coupled to $V_{BB}$. Upon activation of the IN signal on the line 510, a transition from $V_{CC}$ to ground (or $V_{SS}$), is initiated for translation to a second voltage level of $V_{CC}$ to $V_{BB}$. The first and second one-shots 530, 540 provide pulses to ground, which then stabilizes back down to a $V_{BB}$ level. Upon the assertion of the IN signal on the line 510, the first P-channel transistor 520 is turned on and the first one-shot 530 receives a $V_{CC}$ signal on the line 525. At substantially the same time, the assertion of the IN signal on the line 510 turns off the second N-channel transistor 560. Since the INB signal on line 575 is a complementary signal of the IN signal on the line 510, the assertion of IN, which means INB is high, turns off the second P-channel transistor 570.

During the assertion of the IN signal on the line 510, which turns on the first P-channel transistor 520, the line 525 experiences a $V_{CC}$ signal, which turns on the third N-channel transistor 590. Additionally, since at this time the INB on the line 575 is high, the fourth N-channel transistor 595 is turned on, thereby providing a connection to $V_{BB}$. Therefore, during the assertion of the IN signal on the line 510, the N-channel transistors 590, 595 are turned on, providing a connection to $V_{BB}$ to the second one-shot 540. The output of the second one-shot 540 on the line 585 (OUT) experiences a voltage level of $V_{BB}$. This translation occurs in an efficient manner due to the implementation of the first and second one-shots 530, 540. Accordingly, at the assertion of the IN signal on the line 510, the translation from $V_{CC}$ to $V_{SS}$ is efficiently implemented to a voltage level of $V_{CC}$ to $V_{BB}$.

Figure 6:
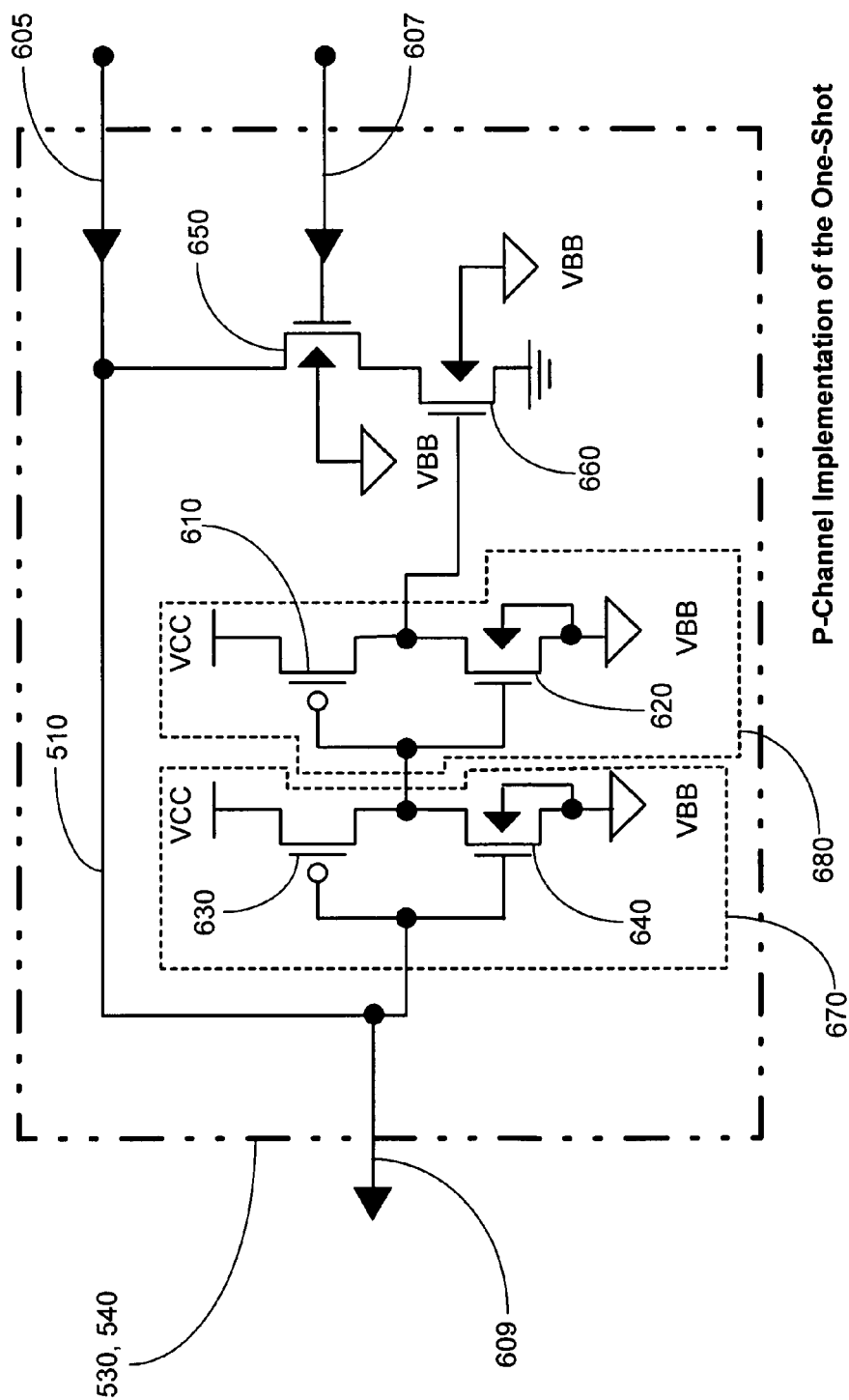
FIG. 6 illustrates a more detailed depiction of a one-shot of the P-channel implementation of the translator of FIG. 5, in accordance with one illustrative embodiment of the present invention.

Turning now to FIG. 6, a more detailed illustration of the first and second one-shots 530, 540 in accordance with an embodiment of the present invention are illustrated. For the interest of clarity and being concise, the first one-shot 530 is described in detail, those skilled in the art having benefit of the present disclosure would appreciate that the second one-shot 540 operates substantially similar. The one-shot 530 receives a signal from line 525, from FIG. 5, on the line 605, which may be related to the signal on the line 525. The one-shot 530 may also receive an input on a line 607, which may be a signal from the line 510 (IN). The signal from the drain of the first P-channel transistor 520, which upon the assertion of the IN signal on the line 510 is connected to $V_{CC}$, is received on the line 605, which is coupled to the output of the one-shot 530 on a line 609, which is OUTB, shown as line 515 in FIG. 5. Turning back to FIG. 6, the one-shot 530 comprises a P-channel transistor 630 whose drain is coupled to an N-channel transistor 640. Additionally, the one-shot 530 comprises another P-channel transistor 610 whose drain is coupled to a drain of an N-channel transistor 620. The source of the P-channel transistor 610 is coupled to $V_{CC}$ and the source of the N-channel transistor 620 is coupled to $V_{BB}$.

The gates of the transistors 630, 640 are coupled together. The set of transistors 630, 640 as shown in FIG. 6 comprise a first inverter 670. Additionally, the gates of the transistors 610, 620 are coupled together. The set of transistors of 610, 620 as shown in FIG. 6 result in a second inverter 680. The transistors 620, 640 each additionally comprise a well-tie that is tied to $V_{BB}$. The one-shot 530 also comprises an N-channel transistor 650 whose source terminal is coupled to the drain terminal of an N-channel transistor 660. The drain terminal of the N-channel transistor 650 is coupled to the line 605. The gate of the N-channel transistor 650 is coupled to line 607, which is the IN signal on the line 510 of FIG. 5. Turning back to FIG. 6, the source of the N-channel transistor 660 is coupled to $V_{SS}$ (i.e., ground). The transistors 650, 660 each comprise a well tie that is coupled to $V_{BB}$.

The N-channel transistor 640 is connected to the second inverter 680 and the activation of the transistor 640 turns on the transistor 610, which provides a connection to $V_{CC}$. This connection to $V_{CC}$ is then used to deactivate the transistor 660, which terminates connection to $V_{SS}$ thereby leaving node 605 in a low-voltage, high impedance state. The OUTB signal on the line 609 is sent to the first inverter 670 whose output is then sent to the second inverter 680. The output of the second inverter 680 is then sent to the N-channel transistor 660. The output of the second inverter 680 may activate or deactivate the N-channel transistor 660, wherein the signal on the line 607 may. activate or deactivate the N-channel 650. Upon an assertion of IN (i.e., active high), the N-channel transistor 650 is turned on. The line 605 goes low because the activation of transistors 650 and 660. Two inverter delays after the activation of transistors 650 and 660 turns off, line 609, which was driven low, will now be driven to a low-voltage, high impedance state.

When line 525, which is coupled to a base terminal of transistor 590, is in a low-voltage, high impedance state, it turns off the transistor 590. Therefore, node 577 goes high, which activates transistor 550. As described above, at this point transistor 560 was already activated. Since transistors 550 and 560 are turned on, node 525 becomes coupled to $V_{BB}$, thereby converting the node 525 from a $V_{CC}$ to ground signal, to a $V_{CC}$ to $V_{BB}$ signal.

The pulse from the first one-shot 530 causes node 525 to settle to the level of $V_{BB}$. An assertion of the IN signal provides an efficient and fast transition to $V_{BB}$, thereby, entering the second voltage operative range of $V_{CC}$ to $V_{BB}$ in an efficient manner (from a first voltage operating range of $V_{CC}$ to $V_{BB}$). Therefore, utilizing the first and second one-shots 530, 540 in the translator 350, a negative voltage translation is used to efficiently translate the voltage level from $V_{CC}$ to ground to a second voltage level of $V_{CC}$ to $V_{BB}$.

Figure 7:
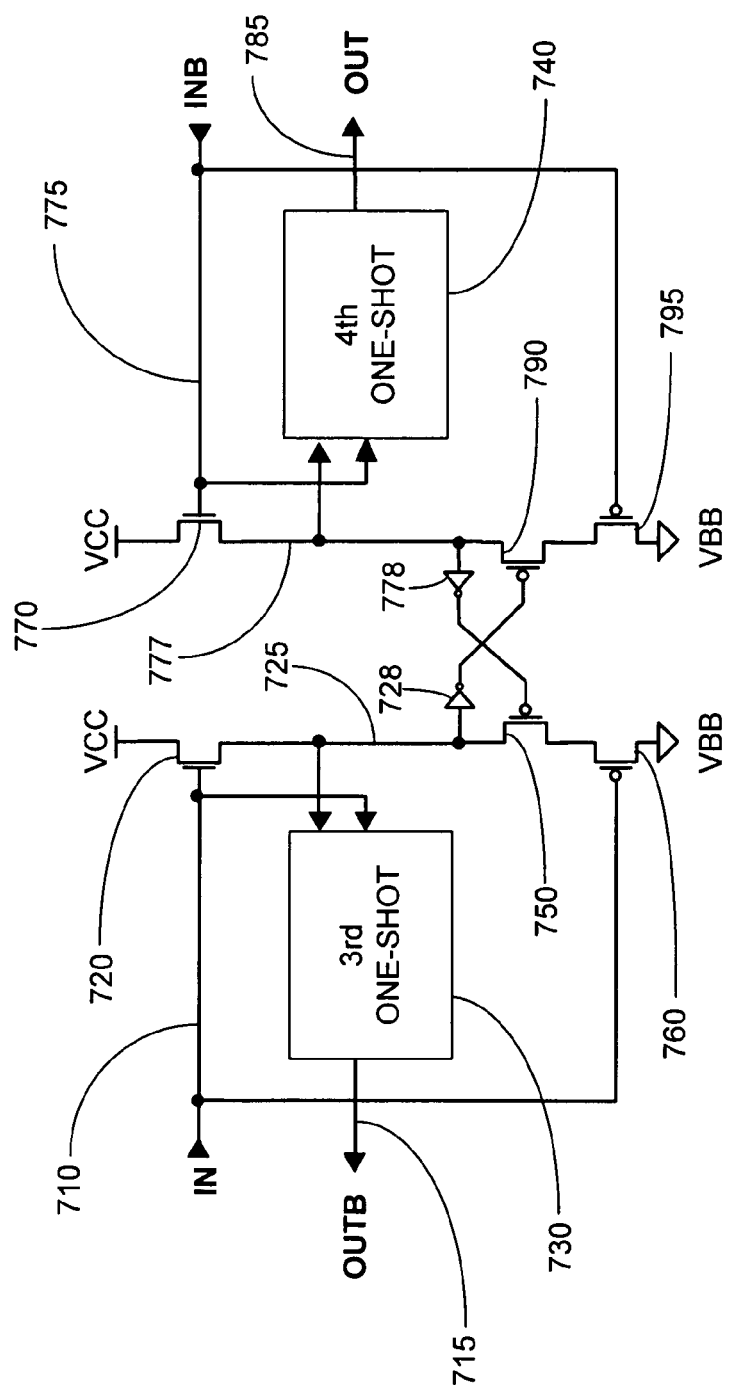
FIG. 7 illustrates a more detailed depiction of an N-channel implementation of the translator of FIGS. 1–4, in accordance with one illustrative embodiment of the present invention.
Figure 8:
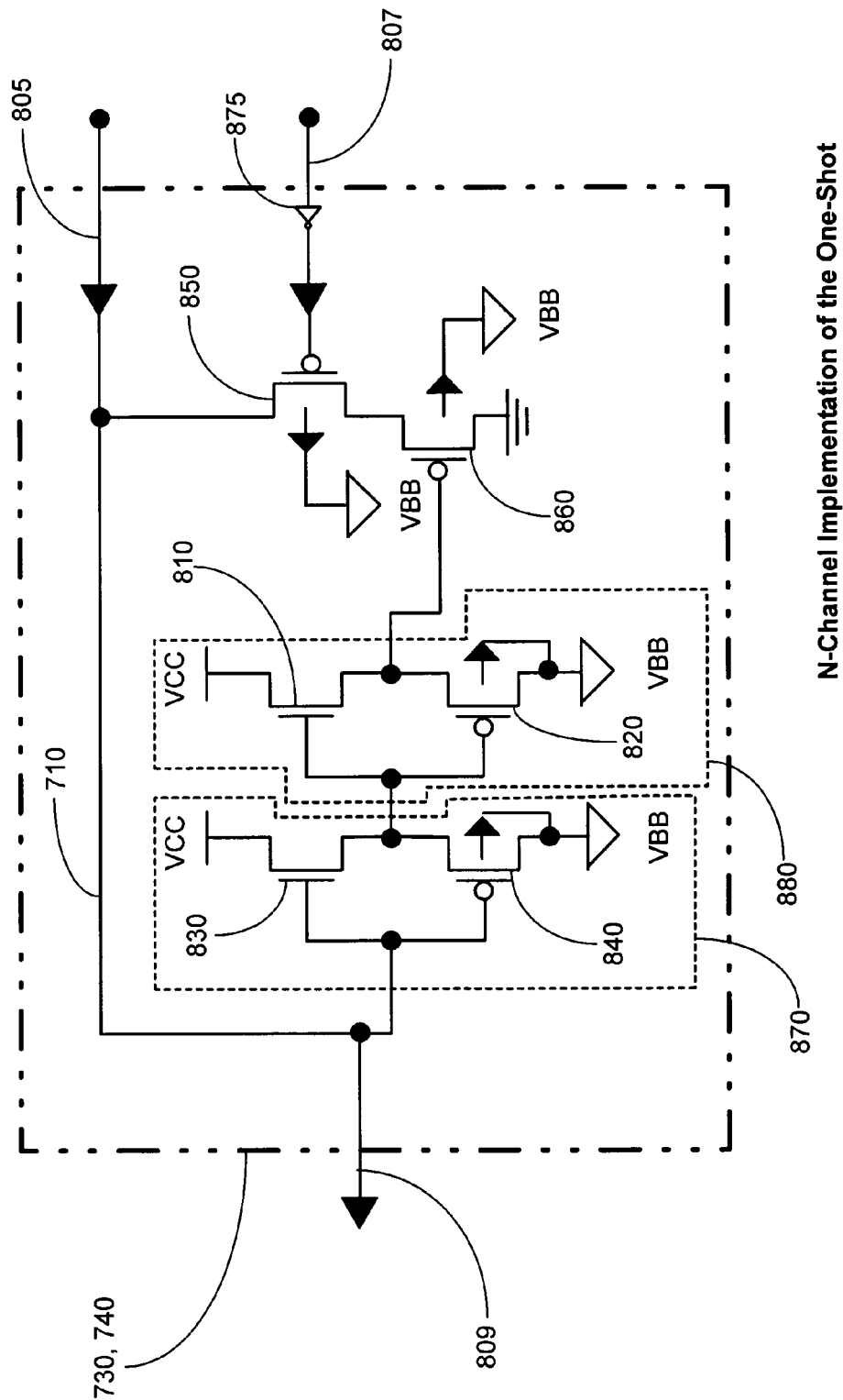
FIG. 8 illustrates a more detailed depiction of a one-shot of the N-channel implementation of the translator of FIG. 7, in accordance with one illustrative embodiment of the present invention.

FIGS. 7 and 8 describe an alternative embodiment of the translator 350. Turning now to FIG. 7, an alternative embodiment of an illustration of the translator 350 is illustrated. In order to implement a voltage level change, an assertion (active high) of the signal IN on a line 710 is asserted. In the embodiment of FIG. 7, an N-channel implementation of the translator 350 is illustrated. The input signal IN on the line 710 is coupled to a gate input to an N-channel transistor 720. The drain of the N-channel transistor 720 is coupled to $V_{CC}$.

The source of the N-channel transistor 720 is coupled to a third one-shot 730. Additionally, the input IN signal on the line 710 is also coupled to the third one-shot 730. Upon the assertion of the input signal IN on the line 710, which in this case is the transition from low to high (active high), the N-channel transistor 720 is turned on wherein a line 725 is connected to $V_{CC}$. This connection activates the third one-shot circuit 730. The third one-shot 730 provides a pulse to drive the output complement signal OUTB on a line 715. A complementary signal of the IN signal (i.e., INB) is on a line 775. When the IN signal on the line 710 goes high (i.e., active), the INB signal on the line 775 is unasserted, or in this case goes low.

The INB signal on the line 775 is coupled to the gate terminal of a second N-channel transistor 770. The drain of the N-channel transistor 770 is coupled to $V_{CC}$ and the source of the second N-channel transistor 770 is coupled to a line 777. The line 777 and the INB signal on a line 775 are both coupled to a fourth one-shot 740. The fourth one-shot 740 is coupled to an output signal on a line 785 (OUT). The fourth one-shot 740 signal provides a low going pulse. Similar to the previous embodiment, a feedback type of situation emerges from the usage of the third and fourth one-shots 730, 740. Upon the activation of the IN signal on the line 710, the OUTB signal on a line 715 generally goes low momentarily due to the third one-shot 730 and then shuts off. Eventually, for the completion of the transition from operating level of $V_{CC}$ to ground, to $V_{CC}$ to $V_{BB}$, the OUTB signal on the line 715 may be raised to the $V_{BB}$ level, which is described below.

The source terminal of the first N-channel transistor 720 on the line 725 is coupled to a source terminal of a P-channel transistor 750. This P-channel transistor 750, via its gate terminal and an inverter 778, is coupled to the line 777, which is the source terminal of the N-channel transistor 770. The drain of the P-channel transistor 750 is coupled to the source terminal of a second P-channel transistor 760. The gate terminal of the P-channel transistor 760 is coupled to the IN signal on the line 710. The drain terminal of the second P-channel transistor 760 is coupled to $V_{BB}$. Similarly, the source terminal of the second N-channel transistor 770 on the line 777 is coupled to a third P-channel transistor 790. The gate terminal of the third P-channel transistor 790 is coupled to the source of the N-channel transistor 720 via the line 725. The drain terminal of the third P-channel transistor 790 is coupled to a fourth P-channel transistor 795 via its source terminal.

The gate terminal of the fourth P-channel transistor 795 is coupled to the INB signal on the line 775. The drain terminal of the fourth P-channel transistor 795 is coupled to $V_{BB}$. Upon activation of the IN signal on the line 710, a transition from $V_{CC}$ to ground (or $V_{SS}$), is initiated for translation to a second voltage level of $V_{CC}$ to $V_{BB}$. The third and fourth one-shots 730, 740 provide pulses to ground, which then stabilizes back up to a $V_{BB}$ level. Upon the assertion of the IN signal on the line 710, the first N-channel transistor 720 is turned on and the third one-shot 730 receives a $V_{CC}$ signal on the line 725. At substantially the same time, the assertion of the IN signal on the line 710 turns off the second P-channel transistor 760. Since the INB signal on line 775 is a complementary signal of the IN signal on the line 710, the assertion of IN, which means INB is at logic low, turns off the second N-channel transistor 770.

During the assertion of the IN signal, which turns on the first N-channel transistor 720, the line 725 experiences a $V_{CC}$ signal, which turns on the third P-channel transistor 790 due to an inverter 728. Additionally, since at this time the INB on the line 775 is low, the fourth P-channel transistor 795 is turned on, thereby providing a connection to $V_{BB}$. Therefore, during the assertion of the IN signal on the line 710, the N-channel transistors 790, 795 are turned on, providing a connection to $V_{BB}$ to the fourth one-shot 740. The output of the fourth one-shot 740 on the line 785 (OUT) experiences a voltage level of $V_{BB}$. This translation occurs in an efficient manner due to the implementation of the third and fourth one-shots 730, 740. Accordingly, at the assertion of the IN signal on the line 710, the translation from the $V_{CC}$ to $V_{SS}$ is efficiently implemented to a voltage level of $V_{CC}$ to $V_{BB}$.

Turning now to FIG. 8, a more detailed illustration of the third and fourth one-shots 730, 740 in accordance with an alternative embodiment of the present invention, is illustrated. Similar to the description above, the third one-shot 730 is described in detail, those skilled in the art having benefit of the present disclosure would appreciate that the fourth one-shot 740 operates substantially similar. The one-shot 730 receives a signal from line 725 from FIG. 7, on the line 805. The one-shot 730 may also receive an input on the line 807, which may be a signal from the line 710 (IN). The signal from the source of the first N-channel transistor 720, which upon the assertion of the IN signal on the line 710 is connected to $V_{CC}$, is received on the line 805, which is coupled to the output of the one-shot 730 on a line 809, which is OUTB, shown as line 715 in FIG. 7. Turning back to FIG. 8, the one-shot 730 comprises an N-channel transistor 830 whose source is coupled to a P-channel transistor 840. Additionally, the one-shot 730 comprises another N-channel transistor 810, whose source is coupled to a source of a P-channel transistor 820. The drain of the N-channel transistor 810 is coupled to $V_{CC}$ and the drain of the P-channel transistor 820 is coupled to $V_{BB}$.

The gates of the transistors 830, 840 are coupled together. The set of transistors 830, 840 as shown in FIG. 8 comprise a third inverter 870. Additionally, the gates of the transistors 810, 820 are coupled together. The set of transistors of 810, 820 as shown in FIG. 8 result in a fourth inverter 880. The transistors 820, 840 each additionally comprise a well-tie that is tied to $V_{BB}$. The one-shot 730 also comprises a P-channel transistor 850 whose drain is coupled to the source of a P-channel transistor 860. The source of the P-channel transistor 850 is coupled to the line 805. The gate of the P-channel transistor 850 is coupled to line 807, which is the IN signal on the line 710 of FIG. 7. Turning back to FIG. 8, the source of the P-channel transistor 860 is coupled to $V_{SS}$ (i.e., ground). The transistors 850, 860 each comprise a well tie that is coupled to $V_{BB}$.

The transistor 840 is connected to the second inverter 880 and the activation of the transistor 840 turns on the transistor 810, which provides a connection to $V_{CC}$. This connection to $V_{CC}$ is then used to deactivate the transistor 860, which terminates connection to $V_{SS}$, thereby leaving node 805 in a low-voltage, high impedance state. The OUTB signal on the line 809 is sent to the first inverter 870 whose output is then sent to the second inverter 880. The output of the second inverter 880 is then sent to the P-channel transistor 860. The output of the second inverter 880 may activate or deactivate the P-channel transistor 860, wherein the signal on the line 807 may activate or deactivate the P-channel 850. Upon an assertion of IN (i.e., active low), the P-channel transistor 850 is turned on. The line 805 goes low because of the activation of transistors 850 and 860. Two inverter delays after the activation of transistors 850 and 860 turns off, line 809, which was driven low, will now be driven to a low-voltage, high impedance state.

In FIG. 7, when line 725, which is coupled to a base terminal of transistor 790, is in a low-voltage, high impedance state, it turns off the transistor 790. Therefore, node 777 goes high, which activates transistor 750 due to the inverter 778. As described above, at this point transistor 760 was already activated. Since transistors 750 and 760 are turned on, node 725 becomes coupled to $V_{BB}$, thereby converting the node 725 from a $V_{CC}$-to-ground signal, to a $V_{CC}$-to-$V_{BB}$ signal.

The pulse from the first one-shot 730 causes node 725 to settle to the level of $V_{BB}$. An assertion of the IN signal provides an efficient and fast transition to $V_{BB}$, thereby, entering the second voltage operative range of $V_{CC}$ to $V_{BB}$ in an efficient manner (from a first voltage operating range of $V_{CC}$ to $V_{BB}$). Therefore, utilizing the first and second one-shots 730, 740 in the translator 350, a negative voltage translation is used to efficiently translate the voltage level from $V_{CC}$ to ground to a second voltage level of $V_{CC}$ to $V_{BB}$.

Utilizing the translator 350 with the implementation of the first and second one-shots 530, 540 (or the third and fourth one-shots 730, 740), an efficient transition from a first voltage level to a second voltage level is performed. The embodiments described herein may provide efficient translation from $V_{CC}$ to ground to a second level of $V_{CC}$ to $V_{BB}$ or conversely a transition from $V_{CC}$-$V_{BB}$ to a level of $V_{CC}$-$V_{SS}$ or ground. Employing the translator 350 described herein may be accomplished in various semiconductor devices. For example, the translator 350 may be implemented into a microprocessor chip, a memory chip, or a variety of other electronic devices. The efficient translation abilities provided by the translator 350 may be used to improve the operation of various processors or memory devices, such as dynamic random access memory (DRAM), a double-data rate synchronous DRAM (DDR SDRAM), a Rambus™ DRAM (RDRAM), a FLASH memory unit, or the like.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A circuit for performing a voltage level translation, said circuit comprising:
   a transistor circuitry for receiving an input signal for translating a signal from a first voltage range to a second voltage range; and
   a first one-shot and a second one-shot operatively coupled to said transistor circuitry, said first and second one-shots to provide at least one pulse for translating said input signal from said first voltage range to said second voltage range.

2. The circuit of claim 1, wherein said transistor circuitry further comprises a voltage level translator, comprising:
   a first transistor operatively coupled to said input signal, said input signal being in said first voltage range, wherein said first one-shot is being driven by said first transistor;
   a second transistor to receive a complementary signal of said input signal, said second transistor to drive said second one-shot to provide a second pulse; and
   a first pair and a second pair of transistors, each pair being operatively coupled to said first and second transistors, said first and second pairs of transistors to provide a transition of a signal from said first voltage range to said second voltage range.

3. The circuit of claim 2, wherein said first voltage range relates to a voltage of $V_{CC}$ to ground.

4. The circuit of claim 2, wherein said second voltage range relates to a voltage of $V_{CC}$ to $V_{BB}$.

5. The circuit of claim 2, wherein said voltage level translator is a negative voltage translator.

6. The circuit of claim 5, wherein said first and second transistors are P-channel transistors.

7. The circuit of claim 6, wherein the source terminals of said first and second transistors are coupled to $V_{CC}$.

8. The circuit of claim 5, wherein said first pair of transistors are N-channel transistors.

9. The circuit of claim 6, wherein the source terminals of said first pair of transistors are respectively coupled to said drain terminals of said first and second transistors.

10. The circuit of claim 9, wherein the drain terminals of said second pair of transistors are respectively coupled to the source terminals of said first pair of transistors.

11. The circuit of claim 6, wherein said source terminals of said second pair of transistors are coupled to a second voltage level relating to said second voltage range, said second pair of transistors being N-channel transistors.

12. The circuit of claim 11, wherein said second voltage level is $V_{BB}$.

13. The circuit of claim 6, wherein a first voltage level relating to said first voltage level is ground.

14. The circuit of claim 6, wherein said first and second one-shots each provide a low-going pulse.

15. The circuit of claim 2, wherein said first one-shot further comprises:
a first inverter to receive a first control signal from said first transistor;
a second inverter operatively coupled to said first inverter;
a first N-channel transistor comprising a well tie to a second voltage level; and
a second N-channel transistor comprising a well tie to said second voltage level, said second N-channel transistor being coupled with said first P-channel transistor, the gate of said second N-channel transistor being coupled to said input signal.

16. The circuit of claim 15, wherein said second one-shot further comprises:
a third inverter to receive a first control signal from said first transistor;
a fourth inverter operatively coupled to said third inverter;
a third N-channel transistor comprising a well tie to a second voltage level, the source terminal of said third N-channel transistor being coupled to said first control signal; and
a fourth N-channel transistor comprising a well tie to said second voltage level, said fourth N-channel transistor being coupled with said third N-channel transistor, the gate of said fourth N-channel transistor being coupled to said complement of said input signal.

17. The circuit of claim 16, wherein said second one-shot provides an output signal that is in said second voltage range.

18. The circuit of claim 2, wherein said first and second transistors are N-channel transistors.

19. The circuit of claim 18, wherein said first and second pair of transistors are P-channel transistors.

20. The circuit of claim 19, wherein said first and second one-shots each provide a high-going pulse.

21. A voltage level translator, comprising:
a first transistor operatively coupled to a control signal, said control signal being in a first voltage range;
a first one-shot circuit driven by said first transistor, said first one-shot circuit to provide a pulse;
a second transistor to receive a complementary signal of said control signal;
a first pair and a second pair of transistors, each pair being operatively coupled to said first and second transistors, said first and second pairs of transistors to provide a transition of a signal from a first voltage range to a second voltage range.

22. The voltage level translator of claim 21, wherein said first voltage range relates to a voltage of $V_{CC}$ to ground.

23. The voltage level translator of claim 21, wherein said second voltage range relates to a voltage of $V_{CC}$ to $V_{BB}$.

24. The voltage level translator of claim 21, wherein said voltage level translator is a negative voltage translator.

25. The voltage level translator of claim 21, wherein said first and second transistors are P-channel transistors.

26. The voltage level translator of claim 21, wherein said first and second pair of transistors are N-channel transistors.

27. The voltage level translator of claim 26, wherein a second voltage level relating to said second voltage range is $V_{BB}$.

28. The voltage level translator of claim 26, wherein a first voltage level relating to said first voltage range is ground.

29. The voltage level translator of claim 26, wherein said first and second one-shot circuits each provide a low-going pulse.

30. The voltage level translator of claim 27, wherein said first one-shot further comprises:
a first inverter to receive a first control signal from said first transistor;
a second inverter operatively coupled to said first inverter;
a first N-channel transistor comprising a well tie to a second voltage level; and
a second N-channel transistor comprising a well tie to said second voltage level, said second N-channel transistor being coupled with said first N-channel transistor, the gate of said second N-channel transistor being coupled to said input signal.

31. The voltage level translator of claim 30, wherein said second one-shot further comprises:
a third inverter to receive a first control signal from said first transistor;
a fourth inverter operatively coupled to said third inverter;
a third N-channel transistor comprising a well tie to a second voltage level, the source terminal of said third N-channel transistor being coupled to said first control signal; and
a fourth N-channel transistor comprising a well tie to said second voltage level, said fourth N-channel transistor being coupled with said third N-channel transistor, the gate of said fourth N-channel transistor being coupled to said complement of said input signal.

32. A system board, comprising:
a processor;
a memory device operatively coupled to said processor, said memory device comprising
a voltage translator circuit, said voltage translator circuit comprising:
a transistor circuitry for receiving an input signal for translating a signal from a first voltage range to a second voltage range; and
a first and second one-shots operatively coupled to said transistor circuitry, said first and second one-shots to provide at least one pulse for translating said input signal from said first voltage range to said second voltage range.

33. The system board of claim 32, wherein said transistor circuitry further comprises a voltage level translator, comprising:
a first transistor operatively coupled to said input signal, said input signal being in said first voltage range, wherein said first one-shot is being driven by said first transistor;
a second transistor to receive a complementary signal of said input signal, said second transistor to drive said second one-shot to provide a second pulse; and
a first pair and a second pair of transistors, each pair being operatively coupled to said first and second transistors, said first and second pairs of transistors to provide a transition of a signal from said first voltage range to said second voltage range.

34. The system board of claim 33, wherein said first voltage range relates to a voltage of $V_{CC}$ to Ground.

35. The system board of claim 33, wherein said second voltage range relates to a voltage of $V_{CC}$ to $V_{BB}$.

36. The system board of claim 33, wherein said first one-shot further comprises:
a first inverter to receive a first control signal from said first transistor;
a second inverter operatively coupled to said first inverter;
a first N-channel transistor comprising a well tie to a second voltage level; and
a second N-channel transistor comprising a well tie to said second voltage level, said second N-channel transistor being coupled with said first N-channel transistor, the gate of said second N-channel transistor being coupled to said input signal.

37. The system board of claim 36, wherein said second one-shot further comprises:
a third inverter to receive a first control signal from said first transistor;
a fourth inverter operatively coupled to said third inverter;
a third N-channel transistor comprising a well tie to a second voltage level, the source terminal of said third N-channel transistor being coupled to said first control signal; and
a fourth N-channel transistor comprising a well tie to said second voltage level, said fourth N-channel transistor being coupled with said third N-channel transistor, the gate of said fourth N-channel transistor being coupled to said complement of said input signal.

38. The system board of claim 32, wherein said system board comprises a printed circuit board.

39. A method for performing a voltage translation of a signal, comprising:
providing a transistor circuitry for receiving an input signal for translating a signal from a first voltage range to a second voltage range; and
providing a first and a second one-shot operatively coupled to said transistor circuitry, providing at least one pulse for translating said input signal from said first voltage range to said second voltage range.

40. The method of claim 39, further comprising activating said first one-shot using said input signal.

41. The method of claim 39, further comprising activating said second one-shot to produce an output signal in said second voltage range.

42. A memory device comprising a voltage translator circuit, said voltage translator circuit comprising:
a transistor circuitry for receiving an input signal for translating a signal from a first voltage range to a second voltage range; and
a first and second one-shots operatively coupled to said transistor circuitry, said first and second one-shots to provide at least one pulse for translating said input signal from said first voltage range to said second voltage range.

43. The memory device of claim 42, wherein said transistor circuitry further comprises:
a first transistor operatively coupled to said input signal, said input signal being in said first voltage range, wherein said first one-shot circuit is being driven by said first transistor;
a second transistor to receive a complementary signal of said control signal, said second transistor to drive a second one-shot circuit to provide a second pulse; and
a first pair and a second pair of transistors, each pair being operatively coupled to said first and second transistors, said first and second pairs of transistors to provide a transition of a signal from a first voltage range to a second voltage range.

44. The memory device of claim 43, wherein said first voltage range relates to a voltage of $V_{CC}$ to Ground.

45. The memory device of claim 44, wherein said second voltage range relates to a voltage of $V_{CC}$ to $V_{BB}$.

46. The memory device of claim 42, wherein said first one-shot further comprises:
a first inverter to receive a first control signal from a first transistor;
a second inverter operatively coupled to said first inverter;
a first N-channel transistor comprising a well tie to a second voltage level; and
a second N-channel transistor comprising a well tie to said second voltage level, said second N-channel transistor being coupled with said first N-channel transistor, the gate of said second N-channel transistor being coupled to said input signal.

47. The memory device of claim 42, wherein said second one-shot further comprises:
a third inverter to receive a first control signal from first transistor;
a fourth inverter operatively coupled to said third inverter;
a third N-channel transistor comprising a well tie to a second voltage level, the source terminal of said third N-channel transistor being coupled to said first control signal; and
a fourth N-channel transistor comprising a well tie to said second voltage level, said fourth N-channel transistor being coupled with said third N-channel transistor, the gate of said fourth N-channel transistor being coupled to said complement of said input signal.

48. A circuit for performing a voltage level translation, said circuit comprising:
a transistor circuitry for receiving an input signal for translating a signal from a first voltage range to a second voltage range;
a first pulse generator to provide a first pulse;
a second pulse generator to provide a second pulse;
wherein said first and second pulse generators operatively coupled to said transistor circuitry, at least one of said first pulse and said second pulse to be used to translate said input signal from said first voltage range to said second voltage range.

49. The circuit of claim 48, wherein said first pulse generator is a first one-shot and the second pulse generator is a second one-shot.

50. The circuit of claim 49, wherein said transistor circuitry further comprises
a voltage level translator, comprising:
a first transistor operatively coupled to said input signal, said input signal being in said first voltage range, wherein said first pulse generator is driven by said first transistor;
a second transistor to receive a complementary signal of said control signal, said second transistor to drive said second pulse generator to provide a second pulse; and
a first pair and a second pair of transistors, each pair respectively being operatively coupled to said first and second transistors, said first and second pairs of transistors to provide a transition of a signal from a first voltage range to a second voltage range.

* * * * *